United States Patent [19]

Hashimoto et al.

[11] Patent Number: 5,574,298

[45] Date of Patent: Nov. 12, 1996

[54] SUBSTRATE CONTACT FOR GATE ARRAY BASE CELL AND METHOD OF FORMING SAME

[75] Inventors: Masashi Hashimoto, Tsukaba, Japan; Louis N. Hutter; S. Shivaling Mahant-Shetti, both of Richarson, Tex.

[73] Assignee: Texas Instruments Incorporated, Dallas, Tex.

[21] Appl. No.: 521,080

[22] Filed: Aug. 29, 1995

Related U.S. Application Data

[63] Continuation of Ser. No. 268,392, Jun. 30, 1994, abandoned.

[51] Int. Cl.⁶ .................................................. H01L 27/10
[52] U.S. Cl. ........................ 257/206; 257/208; 257/369; 257/901
[58] Field of Search ................................. 257/206, 207, 257/208, 204, 901, 372, 281, 337, 341, 269, 369, 343

[56] References Cited

U.S. PATENT DOCUMENTS

| | | | |
|---|---|---|---|
| 3,996,656 | 12/1976 | Cook, Jr. | 257/281 |
| 5,031,018 | 7/1991 | Shirato et al. | 257/204 |
| 5,160,989 | 11/1992 | Houston | 257/901 |
| 5,231,042 | 7/1993 | Ilderem et al. | 437/44 |
| 5,245,202 | 9/1993 | Yasukazu | 257/337 |
| 5,275,962 | 1/1994 | Hashimoto | 257/390 |
| 5,321,280 | 6/1994 | Sakai | 257/208 |
| 5,334,861 | 8/1994 | Pfiester et al. | 257/369 |
| 5,408,118 | 4/1995 | Yamamoto | 257/341 |
| 5,410,171 | 4/1995 | Tsuzuki et al. | 257/337 |
| 5,426,320 | 6/1995 | Zambrano | 257/337 |

FOREIGN PATENT DOCUMENTS

| | | | |
|---|---|---|---|
| 0 280 535 | 8/1988 | European Pat. Off. | 257/337 |
| 3-73563 | 3/1991 | Japan | 257/901 |
| 3-270268 | 12/1991 | Japan | 257/208 |
| 4-2164 | 1/1992 | Japan | 257/206 |
| 4-98876 | 3/1992 | Japan | 257/206 |
| 4-186769 | 7/1992 | Japan | 257/206 |

Primary Examiner—Sara W. Crane
Assistant Examiner—Courtney A. Bowers
Attorney, Agent, or Firm—Christopher L. Maginniss; James C. Kesterson; Richard L. Donaldson

[57] ABSTRACT

A method for forming a gate array substrate contact and the contact resulting therefrom includes the steps of etching off polysilicon gate layers at the same time as cutting the polysilicon to form the gate array base cell (10). The method includes forming openings (40, 42, and 44) in the second insulating layer (34) and insulating layer (30) to connect a lead (46, 48, and 50) to the underlying substrate.

5 Claims, 2 Drawing Sheets

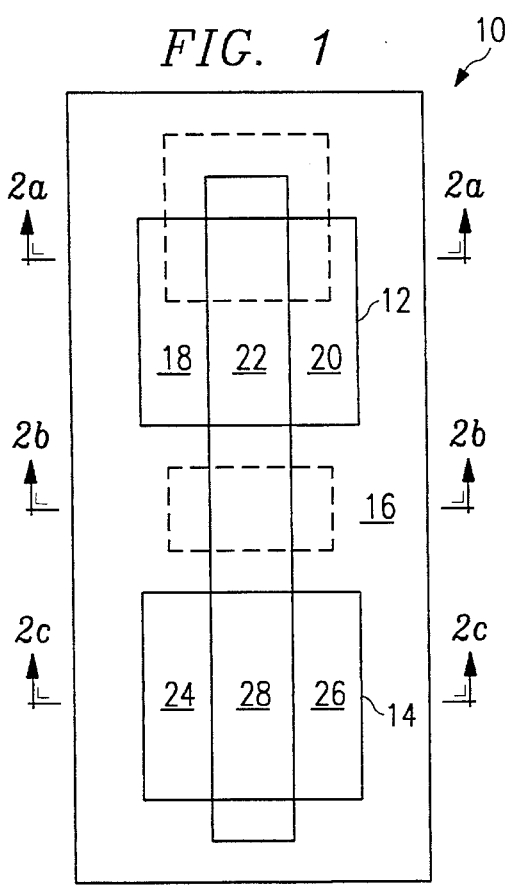
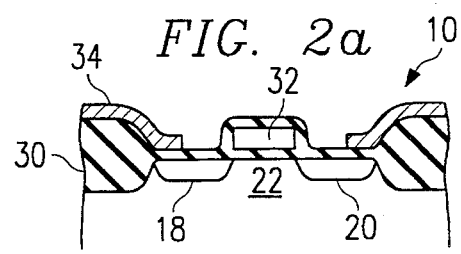
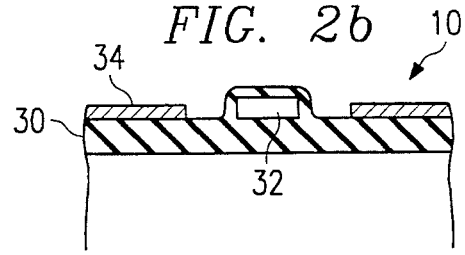
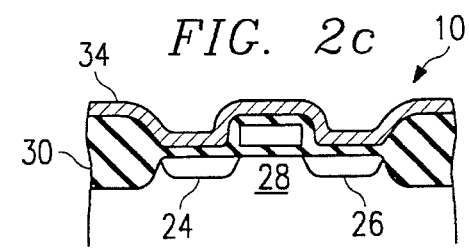
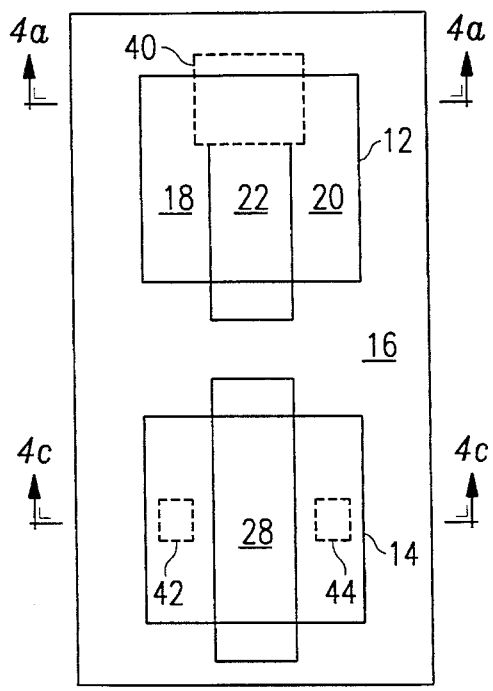
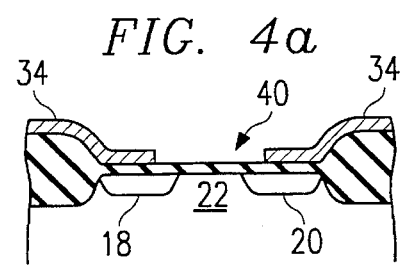
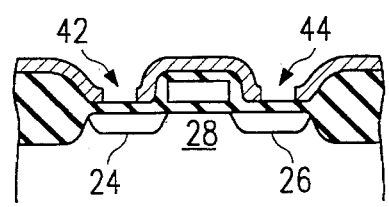

SUBSTRATE CONTACT FOR GATE ARRAY BASE CELL AND METHOD OF FORMING SAME

This application is a continuation of application Ser. No. 08/268,392, filed on Jun. 30, 1994, entitled Substrate Contact for Gate Array Base Cell And Method Of Forming Same, now abandoned.

COPYRIGHT NOTICE

Notice© copyright® Texas Instruments Incorporated 1994. A portion of the disclosure of this patent document contains material which is subject to copyright and maskwork protection. The copyright and maskwork right owner has no objection to the facsimile reproduction by anyone of the patent document or the patent disclosure as it appears in the Patent and Trademark Office patent file or records, but otherwise reserves all copyright and maskwork rights whatsoever.

TECHNICAL FIELD OF THE INVENTION

This invention generally relates to semiconductor devices and their fabrication and, more particularly, to a substrate contact for a gate array base cell and method for forming the same.

BACKGROUND OF THE INVENTION

In the fabrication of integrated circuits, it is often necessary to form a large number of transistors on a single chip. These transistors are interconnected to form logic gates, flip-flops, memory cells, and a wide variety of other devices. A gate array is an array of transistor circuits which utilize the same base cell for many different applications. In this configuration, only the final interconnect levels of the multi-level device are specifically designed for any given application. The initial level, known as the base cell, is the same for each implementation. In typical applications, the base cell includes a heavily-doped moat region separated by a lightly-doped channel region and a gate that insulatively overlies the channel region.

One type of gate array includes some moat regions which have P-doped silicon and other moat regions that include N-doped silicon. These regions can be used to create P-channel and N-channel devices, respectively. One example of an application that uses both conductivity types of channels is a CMOS (complimentary metal oxide semi-conductor device). Many gate array applications electrically connect the gates of adjacent base cells to one another. This electrical connection is often made when the gates are formed during the base cell fabrication. Connected gates are common in CMOS devices such as inverters or NAND gates, for example. In other applications, such as single or complimentary transfer gates or for some dynamic circuits, for example, it is inefficient to "pre-connect" (i.e., connect during base cell fabrication) the gates of adjacent cells. To solve the problem of having both gates that are connected and gates that are not connected, the entire base cell may be redesigned for each application. This custom design approach, however, is costly because more levels of the multi-level fabrication must be built for each specific application. Another solution may be to either connect all base cell gate pairs or leave all base cell gate pairs disconnected. This solution, however, leads to inefficient base cell usage.

Another consideration for CMOS applications is that the substrate be biased to equal or less than the source potential to prevent forward biasing. The substrate potential is given through a highly-doped diffusion. To make an ohmic or resistive contact, $N^+$ and $P^+$ diffusions are chosen for $N^-$ and $P^-$ substrates, respectively. In these configurations, essentially no current flows to the substrate from ground and the power supply. Therefore, a wide range of resistance values are acceptable for the substrate contact. In gate arrays, all diffusions into the moat area are pre-determined, regardless of the position of the contacts and metal lines. In order to employ a conventional substrate contact in gate arrays, therefore, $N^+$ contacts for the P-channel resistor and $P^+$ contacts for the N-channel resistor should be pre-placed throughout the gate array regardless of their necessity. This design, however, wastes a significant amount of silicon area and, thereby, degrades the overall efficiency of the gate array implementation.

SUMMARY OF THE INVENTION

There is a need, therefore, for a gate array that overcomes the problem of silicon area inefficiencies.

There is a further need for a way to provide substrate contacts for CMOS gate arrays that do not require highly-doped diffusion and that increase the gate array silicon area efficiencies.

The present invention, accordingly, provides a method of forming a substrate contact for a gate array base cell that overcomes or substantially reduces limitations associated with existing methods of forming substrate contacts for gate arrays. According to one aspect of the invention, there is provided a method for forming a gate array substrate contact that includes the steps of etching off a gate array base cell layer during that part of the base cell formation of cutting the polysilicon line on the basic cell. A next step is to open a contact region to the substrate while performing the steps of opening the metal one and polymetal one layers in the gate array base cell. Next, a line may be applied through the opening to make contact with the gate array substrate.

A technical advantage of the present invention is that it enhances the gate array silicon area efficiency. The method of the present invention forms a substrate contact without the necessity of a highly-doped diffusion area.

Another technical advantage of the present invention is that the substrate contact position may be chosen in a gate array metal routing stage to produce a highly efficient layout of the gate array substrate contacts.

Another technical advantage of the present invention is that it provides a substantial area savings without requiring an additional interconnect level. The interconnect layout is much more flexible in the present invention than what occurs in known structures. Moreover, the above technical advantages are provided by the present invention without any significant additional fabrication costs.

BRIEF DESCRIPTION OF THE DRAWINGS

The invention and its modes of use and advantages are best understood by reference to the following description of illustrative embodiments when read in conjunction with the accompanying drawings, wherein:

FIG. 1 illustrates a top-down conceptual diagram of a gate array base cell that shows placement of cuts within the polysilicon gate layers;

FIGS. 2a through 2c show cross sections of the gate array base cell of FIG. 1;

FIG. 3 shows the formation of contact holes to the gate array base cell substrate according to the steps of the present embodiment;

FIGS. 4a and 4c illustrate respective cross sections of the FIG. 3 gate array base cell;

DETAILED DESCRIPTION OF THE PREFERRED EMBODIMENTS

Figure 5:
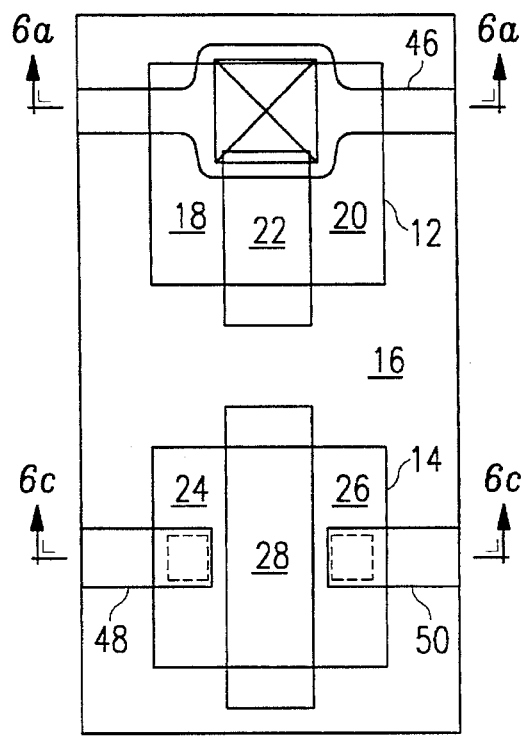
FIG. 5 shows contact formation for an exemplary embodiment of the present invention.

The making and use of the presently preferred embodiments are discussed below in detail. However, it should be appreciated that the present invention provides many applicable inventive concepts that can be embodied in a wide variety of specific contexts. The specific embodiments discussed, therefore, are merely illustrative of specific ways to make and use the invention and do not limit the scope of the present invention. Several variations within the following description appear below along with some examples of using the present embodiment. Finally, one sample method of fabricating the present embodiment will be discussed below.

Referring first to FIG. 1, a preferred embodiment gate array base cell 10 is shown in a top-view layout form. Base cell 10 includes moat region 12 and moat region 14 that insulation region 16 separates. Moat region 12 is separated into two portions 18 and 20 by channel region 22. Likewise, moat region 14 is separated into two portions 24 and 26 by channel region 28. Moat regions 12 and 14 are isolated on all sides from like regions in base cell 10 by isolation region 16.

Moat regions 12 and 14 are typically formed from heavily-doped silicon. In some applications, such as CMOS (complimentary metal oxide semiconductor) devices, for example, moat region 12 is formed of heavily P-doped silicon and moat region 14 is formed of heavily N-doped silicon, or vice-versa. Channel regions 22 and 28 are typically formed from lightly-doped silicon. The conductivity of channel 22, and likewise channel 28, is typically opposite that of the remainder of the respective moat region 12 or 14.

FIGS. 2a, 2b, and 2c show cross-sectional views of base cell 10 of FIG. 1. In particular, FIG. 2a shows base cell 10 cross-section having moat region portions 18 and 20 separated by channel region 22. Insulating layer 30 covers portions 18 and 20 as well as channel region 22. Conductive gate 32 is disposed above the channel region 22. Insulating layer 30 also covers conductive gate 32. Covering insulating layer 30 and at least part of portions 18 and 20 is a second insulation layer 34. Likewise, in FIG. 2b the insulating layer 30 also covers isolation region 16. Conductive gate 32 is on insulating layer 30 and insulating layer 30 covers conductive gate 32. In FIG. 2b, the second insulating layer 34 covers a portion of insulating layer 30. FIG. 2c furthermore shows the identified cross-section of base cell 10 of FIG. 1. Portions 24 and 26 are separated by channel region 28 with insulating layer 30 covering portions 24 and 26 as well as channel region 28, and conductive gate 32. In FIG. 2c, the second insulating layer 34 covers insulating layer 30.

The present embodiment, referring to FIGS. 1 and 2a through 2c is formed by etching off the second insulating layer 34 according to the areas defined by the respective boxes 36 and 38, for example. These may be etched off at the same time that the selective polysilicon line cutting occurs in forming base cell 10. U.S. Pat. No. 5,275,962, entitled "Mask Programmable Gate Array Base Cell," by N. Hashimoto, et al. and assigned to Texas Instruments Incorporated (hereinafter Hashimoto), is incorporated herein and describes a method for forming a semiconductor gate array structure on a semiconductor substrate that provides a substantial area savings without requiring an additional interconnect level. Part of the base cell of Hashimoto includes forming an interconnect line to create desired connections within base cell 10. In forming base cell 10, of the present embodiment, interconnect lines may be formed from a metal such as tungsten or titanium or aluminum. Also, a multilevel interconnect scheme may be implemented by forming an additional insulating layer and forming additional interconnect lines. Forming the polysilicon cut at the same time that these interconnect lines are cut permits accessing insulating layer 30 with no or few additional steps in the process.

FIG. 3 shows the next step in the process of forming substrate contact openings as defined by dash-line box 40 over moat region 12 and by dash-line boxes 42 and 44 over moat region 14. FIGS. 4a and 4c show cross-sectional views of the respective positions identified in FIG. 3 and relate to the same positions or base cell 10 as appear in FIGS. 2a and 2c, above. The substrate contact opening step of the present embodiment is to remove insulating layer 30 and conductive gate 32 in the areas that box 40 describes to produce the structure of FIG. 4a. This exposes channel region 22 and portions 18 and 20 beneath the second insulating layer 34. Similarly, in FIG. 4c boxes 42 and 44 define the area of insulating layer 30 is removed to access portions 24 and 26.

Figure 6A:
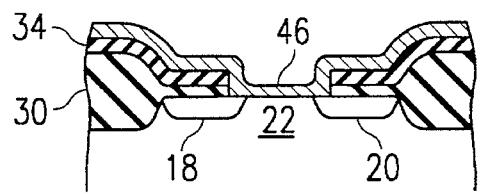
FIGS. 6a and 6c illustrate respective cross sections of the FIG. 5 gate array base cell.
Figure 6C:
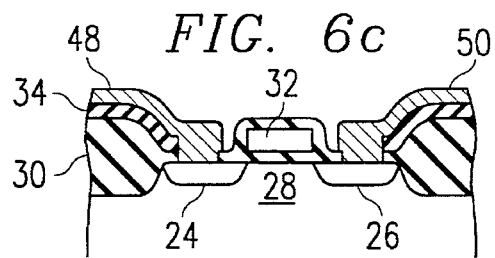

With the openings 40, 42 and 44 to the respective underlying moat and channel regions, it is possible to form an interconnect line, as FIGS. 5 illustrates. In particular, FIG. 5 shows lead 46 formed over opening 40 to moat 12. In addition, leads 48 and 50 cover openings 42 and 44 to contact portions 24 and 26, respectively, of moat region 14. Referring to FIG. 6a, lead 46 covers insulating layer 30 to contact portions 18 and 20 and channel region 22 of moat region 12. Likewise, FIG. 6c shows lead 48 covering isolating layer 30 and contacting portion 24, while lead 50 covers insulating layer 30 and, through opening 44, contacts portion 26.

Base cell 10 may be one of many like cells in a gate array. Typical gate arrays may have as many as 300,000 to 500,000 cells or more. The cells are formed into desired circuits by forming interconnects between cells. The entire array is covered with an insulating material, such as an oxide, for example. Contact holes are formed in the insulating material to connect the interconnect line with the underlying structure. Interconnect technology, including multi-level interconnect technology is well-known in the current art. The interconnects are typically formed subsequent to etching the gate.

A large number of varying devices may be formed within the gate array. General logic circuits which utilize both N-channel and P-channel moat regions with connected gates include inverters and NAND gates. Other devices such as flip-flops, static random access memories, read-only memories, or multi-port memories, for example, may be formed. Some circuits which require electrically uncoupled gates for the P-channel and N-channel device include single or complimentary transfer gates for some dynamic circuits, as examples.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is, therefore, intended that the appended claims encompass any such modifications or embodiments.

What is claimed is:

1. A substrate contact, comprising:

a substrate of a first conductivity type;

a base cell including two heavily doped source/drain regions of a second conductivity type formed in said substrate and a lightly doped region in said substrate of said first conductivity type disposed therebetween and in contact with said two source/drain regions of said second conductivity type;

a first insulating layer extending over said two source/drain regions and said region therebetween of said first conductivity type;

a second insulating layer covering at least a portion of said first insulating layer; and an electrically conductive material extending through said first and second insulating layers and forming electrical contact with said lightly doped region of said first conductivity type and both said source/drain regions of said second conductivity type.

2. The substrate contact of claim 1, wherein said electrically conductive material comprises tungsten material.

3. The substrate contact of claim 1, wherein said electrically conductive material comprises titanium material.

4. The substrate contact of claim 1, wherein said electrically conductive material comprises aluminum material.

5. The substrate contact of claim 1 herein said conductive material is selected from the group consisting of tungsten, titanium and aluminum.

* * * * *